United States Patent
Yoon et al.

(10) Patent No.: US 12,417,934 B2
(45) Date of Patent: Sep. 16, 2025

(54) SUBSTRATE TREATING APPARATUS AND SUBSTRATE TRANSFER ROBOT

(71) Applicant: SEMES CO., LTD., Cheonan-si (KR)

(72) Inventors: Do Hyeon Yoon, Cheonan-si (KR); Yong Hee Lee, Cheonan-si (KR); Jin Woo Jung, Cheonan-si (KR); Mi So Park, Daejeon (KR)

(73) Assignee: Semes Co., Ltd., Chungcheongnam-do (KR)

( * ) Notice: Subject to any disclaimer, the term of this patent is extended or adjusted under 35 U.S.C. 154(b) by 293 days.

(21) Appl. No.: 17/745,116

(22) Filed: May 16, 2022

(65) Prior Publication Data

US 2022/0367221 A1    Nov. 17, 2022

(30) Foreign Application Priority Data

May 17, 2021    (KR) .......................... 10-2021-0063629

(51) Int. Cl.
*B08B 3/08*    (2006.01)
*B08B 13/00*    (2006.01)
(Continued)

(52) U.S. Cl.
CPC .......... *H01L 21/67288* (2013.01); *B08B 3/08* (2013.01); *B08B 13/00* (2013.01);
(Continued)

(58) Field of Classification Search
None
See application file for complete search history.

(56) References Cited

U.S. PATENT DOCUMENTS

2019/0096720 A1*  3/2019  Naohara ................. G06T 7/001
2020/0219736 A1   7/2020  Aoki et al.

FOREIGN PATENT DOCUMENTS

CN    111415884 A    7/2020
JP    2007165366 A    6/2007
(Continued)

OTHER PUBLICATIONS

Office Action dated Nov. 7, 2022 issued in related Korean patent application No. 10-2021-0063629.
(Continued)

*Primary Examiner* — Levon J Shahinian
(74) *Attorney, Agent, or Firm* — Harness, Dickey & Pierce, P.L.C.

(57) ABSTRACT

The present invention provides a substrate treating apparatus. The substrate treating apparatus includes: a liquid treatment chamber configured to treat a substrate with a liquid; a drying chamber configured to dry the liquid-treated substrate; a transfer robot configured to transfer the substrate between the liquid treatment chamber and the drying chamber, and including a hand which is movable along an X-axis, a Y-axis, and a Z-axis and is rotatably driven based on the Z-axis, and on which the substrate is placed; an optical system configured to photograph a form of a liquid film of the substrate, in which when the substrate is transferred from the liquid treatment chamber to the drying chamber, the substrate is wetted with a chemical liquid and is transferred by the transfer robot in a state of being formed with a liquid film formed; and a controller configured to measure the form of the liquid film photographed by the optical system.

12 Claims, 9 Drawing Sheets

(51) Int. Cl.
  *B25J 11/00* (2006.01)
  *B25J 19/02* (2006.01)
  *F26B 5/00* (2006.01)
  *F26B 25/00* (2006.01)
  *G01B 11/06* (2006.01)
  *G01B 11/24* (2006.01)
  *H01L 21/02* (2006.01)
  *H01L 21/67* (2006.01)
  *H01L 21/677* (2006.01)
  *H01L 21/687* (2006.01)

(52) U.S. Cl.
  CPC ........ *F26B 5/005* (2013.01); *H01L 21/67703* (2013.01); *H01L 21/68707* (2013.01)

(56) References Cited

FOREIGN PATENT DOCUMENTS

| | | | |
|---|---|---|---|
| JP | 2010-060385 A | 3/2010 | |
| JP | 2018182217 A | 11/2018 | |
| JP | 2020113576 A | 7/2020 | |
| JP | 2020-161609 A | 10/2020 | |
| JP | 2021064653 A | 4/2021 | |
| KR | 10-2017-0137240 A | 12/2017 | |
| KR | 10-2063322 | 1/2020 | |
| TW | 202030836 A | 8/2020 | |
| WO | WO-2015098153 A1 | 7/2015 | |
| WO | 2020195175 A1 | 10/2020 | |

OTHER PUBLICATIONS

Japanese Office Action, dated Jul. 4, 2023, issued in corresponding Japanese Patent Application No. 2022-077501.
Office Action issued Jul. 10, 2025 in Chinese Application No. 202210541134.9.

* cited by examiner

SUBSTRATE TREATING APPARATUS AND SUBSTRATE TRANSFER ROBOT

CROSS-REFERENCE TO RELATED APPLICATIONS

This application claims priority to and the benefit of Korean Patent Application No. 10-2021-0063629 filed in the Korean Intellectual Property Office on May 17, 2021, the entire contents of which are incorporated herein by reference.

TECHNICAL FIELD

The present invention relates to a transfer robot for transferring a substrate and a substrate treating apparatus including the same.

BACKGROUND ART

In order to manufacture a semiconductor device, a desired pattern is formed on a substrate through various processes, such as photography, etching, ashing, ion implantation, and thin film deposition. Various treatment liquids are used in each process, and contaminants and particles are generated during the process. In order to solve this problem, a cleaning process for cleaning contaminants and particles is performed before and after each process.

In general, the cleaning process performs a liquid treatment process and a dry treatment process. In the liquid treatment process, a treatment liquid is supplied on the substrate, and in the dry treatment process, the liquid remaining on the substrate is removed. The liquid treatment process includes a chemical treatment step, a rinse operation, and a solvent replacement operation. The chemical treatment operation removes foreign substances on the substrate with chemicals, the rinse operation removes chemicals remaining on the substrate, and the solvent replacement operation replaces the rinse solution remaining on the substrate with an organic solvent.

Figure 1:
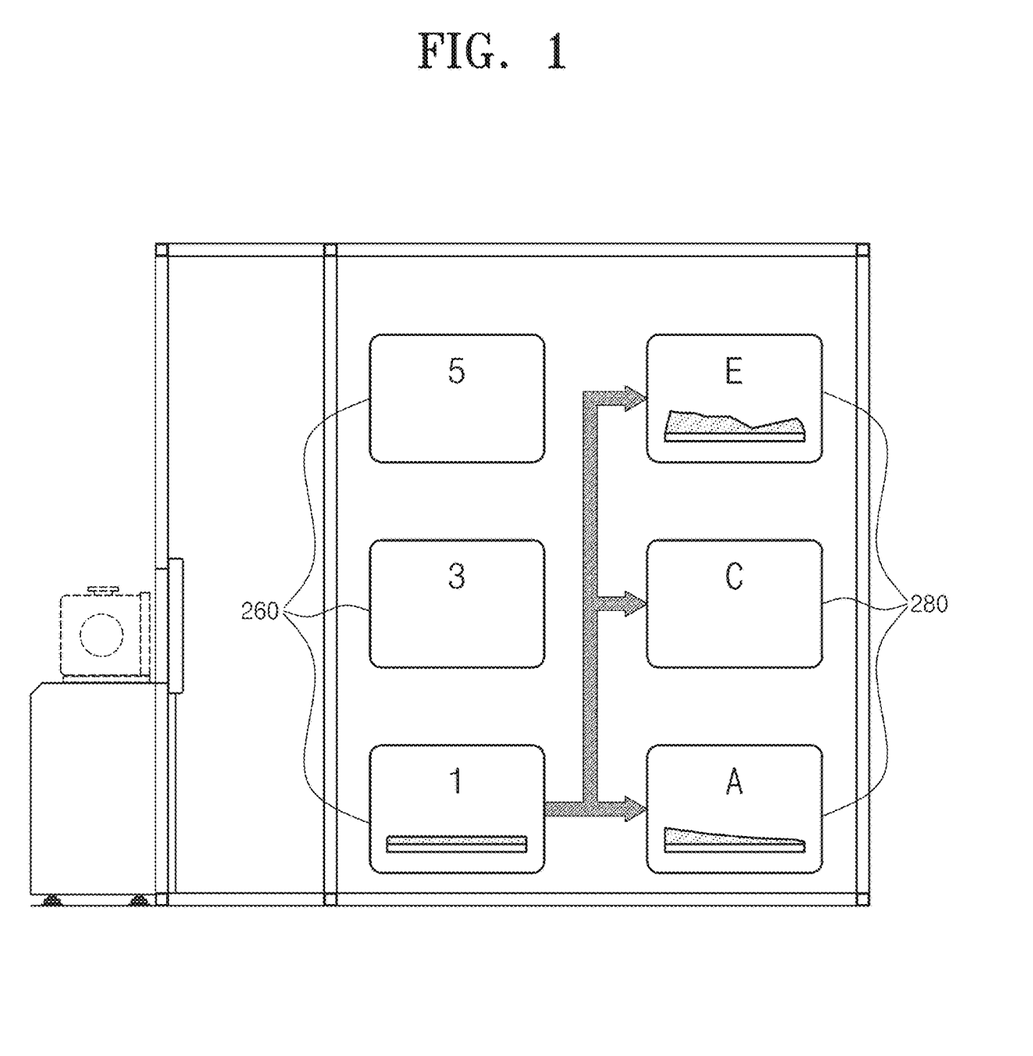
FIG. 1 is a diagram illustrating a problem occurring in a cleaning facility in the related art.

This will be described with reference to FIG. 1. In general, the chemical treatment operation, the rinsing operation, and the solvent replacement operation are performed in a liquid treatment chamber 260, and the drying treatment operation is performed in a drying chamber 280. Accordingly, the substrate on which the solvent replacement operation has been completed is transferred to the drying chamber 280.

Semiconductor equipment for cleaning substrates usually has an n-column and m-layer structure. In this case, the liquid treatment chamber 260 and the drying chamber 280 are randomly matched rather than matched with each other on the same layer. If the substrate processed in the liquid treatment chamber 260 of the first-row and first-floor is matched with the second-row and third-layer drying chamber, the substrate moves in the X, Y, and Z-axes and rotates, so that the behavior of the solvent is the most severe.

SUMMARY OF THE INVENTION

The present invention has been made in an effort to provide a substrate treating apparatus capable of efficiently treating a substrate and a substrate transfer robot.

The present invention has also been made in an effort to provide a substrate treating apparatus capable of solving drying defects that may occur due to a process in which a substrate moves between a liquid treatment chamber and a drying chamber, and a substrate transfer robot.

The present invention has also been made in an effort to provide a substrate treating apparatus and a substrate transfer robot, which are capable of solving a problem from a part unit when the problem occurs after drying completion by providing a monitoring system for a liquid film formed by being discharged on a substrate of a substrate W in a substrate treatment facility including a liquid treatment chamber.

The object of the present invention is not limited thereto, and other objects not mentioned will be clearly understood by those of ordinary skill in the art from the following description.

An exemplary embodiment of the present invention provides a substrate treating apparatus, including: a liquid treatment chamber configured to treat a substrate with a liquid; a drying chamber configured to dry the liquid-treated substrate; a transfer robot configured to transfer the substrate between the liquid treatment chamber and the drying chamber, and including a hand which is movable along an X-axis, a Y-axis, and a Z-axis and is rotatably driven based on the Z-axis, and on which the substrate is placed; an optical system configured to photograph a form of a liquid film of the substrate, in which when the substrate is transferred from the liquid treatment chamber to the drying chamber, the substrate is wetted with a chemical liquid and is transferred by the transfer robot in a state of being formed with a liquid film formed; and a controller configured to measure the form of the liquid film photographed by the optical system.

In the exemplary embodiment, the optical system may transmit first data obtained by photographing the form of the liquid film to the controller in the state where the transfer robot picks up the substrate in the liquid treatment chamber, before the transfer robot injects the substrate into the drying chamber, the optical system may transmit second data obtained by photographing the form of the liquid film to the controller, and the controller may compare the first data and the second data, and when the form of the liquid film of the second data is out of an error range in comparison with the first data, the controller may determine whether to load the substrate into the drying chamber and stores the second data.

In the exemplary embodiment, the optical system may be a camera which photographs an edge region of the substrate from a lateral surface of the substrate.

In the exemplary embodiment, the camera may be provided to photograph a first lateral surface of the substrate and a second lateral surface that is the other side of the first lateral surface.

In the exemplary embodiment, the controller may measure a first contact angle that is a contact angle of the chemical liquid with respect to the first lateral surface of the substrate and a second contact angle that is a contact angle of the chemical liquid with respect to the second lateral surface of the substrate.

In the exemplary embodiment, the optical system may transmit first data obtained by photographing the form of the liquid film to the controller in the state where the transfer robot picks up the substrate in the liquid treatment chamber, before the transfer robot injects the substrate into the drying chamber, the optical system may transmit second data obtained by photographing the form of the liquid film to the controller, the controller may measure a first contact angle that is a contact angle of the chemical liquid with respect to the first lateral surface of the substrate and a second contact angle that is a contact angle of the chemical liquid with respect to the second lateral surface of the substrate, and the controller may compare the first contact angle of the first data and the first contact angle of the second data, and compare the second contact angle of the first data and the second contact angle of the second data, and when the first contact angle and the second contact angle of the second data are out of error ranges of the first contact angle and the second contact angle of the first data, the controller may determine whether to load the substrate into the drying chamber and stores the second data.

In the exemplary embodiment, the stored second data may be provided as analysis data when drying defect of the substrate occurs in the drying chamber.

In the exemplary embodiment, the transfer robot may further include a shade member disposed above the hand, and the optical system may be provided while being installed in the shade member.

In the exemplary embodiment, the optical system may measure a height of the liquid film.

In the exemplary embodiment, a plurality of liquid treatment chambers may be provided while being stacked in an array of N columns and M rows, a plurality of drying chambers may be provided while being stacked in an array of n columns and m rows, and the transfer robot may transfer the substrate to a position according to a recipe between the plurality of liquid treatment chambers and the plurality of drying chambers.

In the exemplary embodiment, the drying chamber may be a supercritical treatment chamber which dries the substrate with a supercritical fluid.

Another exemplary embodiment of the present invention provides a method of treating a substrate by transferring the substrate from a first chamber to a second chamber, in which the transferred substrate is wetted with a chemical liquid and is transferred by a transfer robot in the state of being formed with a liquid film, the transfer robot includes a hand which is movable along an X-axis, a Y-axis, and a Z-axis and is rotatably driven based on the Z-axis, and on which the substrate is placed, and a form of the liquid film of the substrate is photographed and the photographed form of the liquid film is measured.

In the exemplary embodiment, first data obtained by photographing the form of the liquid film may be stored in the state where the transfer robot picks up the substrate in the first chamber, before the transfer robot injects the substrate into the second chamber, second data obtained by photographing the form of the liquid film may be stored, and a controller may compare the first data and the second data, and when the form of the liquid film of the second data is out of an error range in comparison with the first data, the controller may determine whether to load the substrate into the second chamber and stores the second data.

In the exemplary embodiment, first data obtained by photographing the form of the liquid film may be stored in the state where the transfer robot picks up the substrate in the first chamber, before the transfer robot injects the substrate into the second chamber, second data obtained by photographing the form of the liquid film may be stored, and a controller may measure a first contact angle that is a contact angle of the chemical liquid with respect to a first lateral surface of the substrate and a second contact angle that is a contact angle of the chemical liquid with respect to a second lateral surface of the substrate, and the controller may compare the first contact angle of the first data and the first contact angle of the second data, and compare the second contact angle of the first data and the second contact angle of the second data, and when the first contact angle and the second contact angle of the second data are out of error ranges of the first contact angle and the second contact angle of the first data, the controller may determine whether to load the substrate to the second chamber and stores the second data.

In the exemplary embodiment, the stored second data may be provided as analysis data when drying defect of the substrate occurs in the drying chamber.

In the exemplary embodiment, the first chamber may be a liquid treatment chamber, and the second chamber may be a drying chamber.

In the exemplary embodiment, the drying chamber may be a supercritical treatment chamber which dries the substrate with a supercritical fluid.

According to various exemplary embodiments of the present invention, it is possible to efficiently treat a substrate.

According to various exemplary embodiments of the present invention, it is possible to solve drying defect that may occur due to the process in which the substrate moves between the liquid treatment chamber and the drying chamber.

According to the exemplary embodiments of the present invention, the liquid treatment facility including the liquid treatment chamber, a monitoring system for the liquid film discharged and formed on the surface of the substrate W is provided, so that it is possible to solve a problem in the part unit when the problem occurs after the drying completion.

The effect of the present invention is not limited to the foregoing effects, and those skilled in the art may clearly understand non-mentioned effects from the present specification and the accompanying drawings.

DETAILED DESCRIPTION

Hereinafter, an exemplary embodiment of the present invention will be described more fully hereinafter with reference to the accompanying drawings, in which exemplary embodiments of the invention are shown. However, the present invention can be variously implemented and is not limited to the following embodiments. In addition, in describing an exemplary embodiment of the present invention in detail, if it is determined that a detailed description of a related well-known function or configuration may unnecessarily obscure the gist of the present invention, the detailed description thereof will be omitted. In addition, the same reference numerals are used throughout the drawings for parts having similar functions and actions.

In addition, unless explicitly described to the contrary, the word "comprise" and variations such as "comprises" or "comprising", will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

An expression, "and/or", includes each of the mentioned items and all of the combinations including one or more of the items. Further, in the present specification, "connected" means not only when member A and member B are directly connected, but also when member A and member B are indirectly connected by interposing member C between member A and member B.

The exemplary embodiment of the present invention may be modified in various forms, and the scope of the present invention should not be construed as being limited to the following exemplary embodiments. The present exemplary embodiment is provided to more completely explain the present invention to those skilled in the art. Therefore, the shapes of elements in the drawings are exaggerated to emphasize clearer descriptions.

Figure 2:
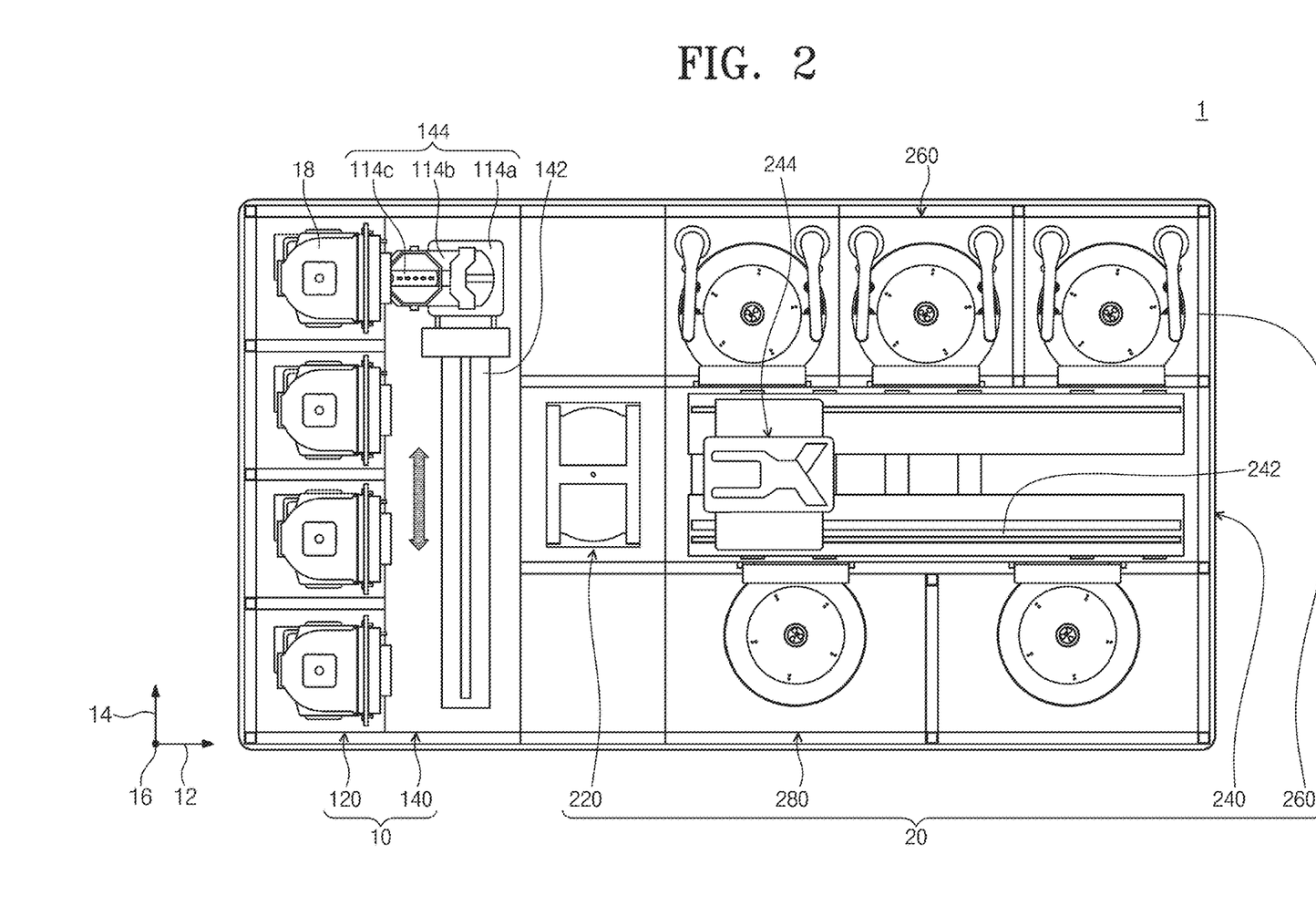
FIG. 2 is a top plan view illustrating a substrate treating facility according to an exemplary embodiment of the present invention.
Figure 3:
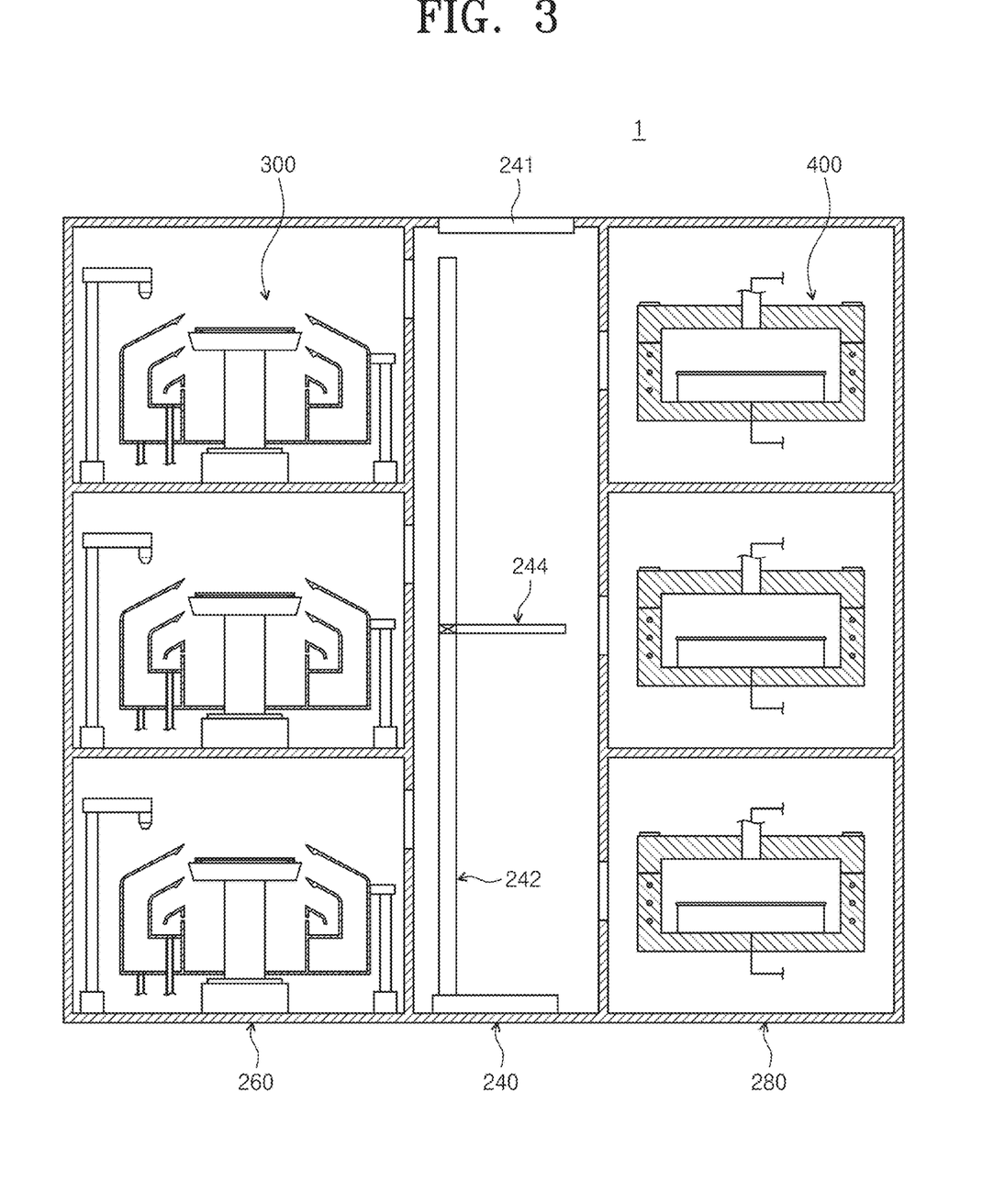
FIG. 3 is a cross-sectional view of the substrate treating facility of FIG. 2 viewed in a direction of A-A.

FIG. 2 is a top plan view illustrating a substrate treating facility according to an exemplary embodiment of the present invention. FIG. 3 is a cross-sectional view of the substrate treating facility of FIG. 2 viewed in a direction of A-A. The substrate treating facility will be described with reference to FIGS. 2 and 3. The substrate treating facility 1 treating a substrate includes an index module 10 and a process processing module 20. The index module 10 includes a load port 120 and a transfer frame 140. The load port 120, the transfer frame 140, and the process processing module 20 may be sequentially arranged in series. Hereinafter, a direction in which the load port 120, the transfer frame 140, and the process processing module 20 are arranged is called to as a first direction 12, and a direction perpendicular to the first direction 12 when viewed from the top is called a second direction 14, and a direction perpendicular to a plane including the first direction 12 and the second direction 14 is called a third direction 16.

A carrier 18 in which a substrate W is accommodated is seated on the load port 120. The load port 120 is provided in plurality, and the plurality of load ports 120 is arranged in series in the second direction 14. In FIG. 2, it is illustrated that four load ports 120 are provided. However, the number of load ports 120 may be increased or decreased according to process efficiency of the process processing module 20 and a condition of foot print, and the like. Slots (not illustrated) provided to support an edge of the substrate are formed in the carrier 18. A plurality of slots is provided in the third direction 16, and the substrates are positioned within the carrier so as to be stacked while being spaced apart from each other in the third direction 16. As the carrier 18, a Front Opening Unified Pod (FOUP) may be used.

The process processing module 20 includes a buffer unit 220, a transfer chamber 240, and a liquid treatment chamber 260 and a drying chamber 280 as treatment chambers. The transfer chamber 240 is disposed so that a longitudinal direction thereof is parallel to the first direction 12. In the liquid treatment chamber 260 and the drying chamber 280 as the treatment chambers, the substrate is treated therein, and an entrance through which the substrate enters and exits is formed. The liquid treatment chambers 260 are disposed at one side of the transfer chamber 240 in the second direction 14, and eth drying chambers 280 are disposed at the other side of the transfer chamber 240. The liquid treatment chambers 260 and the drying chambers 280 may be provided to be symmetric to each other based on the transfer chamber 240. Some of the liquid treatment chambers 260 are disposed in the longitudinal direction of the transfer chamber 240. Further, some of the liquid treatment chambers 260 are disposed to be stacked with each other. That is, the liquid treatment chambers 260 may be disposed in an array of A×B (each of A and B is a natural number equal to or larger than 1) at one side of the transfer chamber 240. Herein, A is the number of liquid treatment chambers 260 provided in series in the first direction 12, and B is the number of liquid treatment chambers 260 provided in series in the third direction 16. When six or nine liquid treatment chambers 260 are provided at one side of the transfer chamber 240, the liquid treatment chambers 260 may be disposed in an array of 3×2 or 3×3. The number of liquid treatment chambers 260 may also increase or decrease. Similar to the liquid treatment chambers 260, the drying chambers 280 may be arranged in an array of M×N (each of M and N is a natural number equal to or larger than 1). Herein, M and N may be the same as A and B, respectively. Unlike the foregoing description, both the liquid treatment chambers 260 and the drying chambers 280 may be provided only at one side of the transfer chamber 240. Further, unlike the foregoing description, each of the liquid treatment chambers 260 and the drying chamber 280 may be provided in a single layer at one side and the other side of the transfer chamber 240. Optionally, the liquid treatment chamber 260s may be positioned to be stacked at one side of the transfer chamber 240, and the drying chambers 280 may be positioned to be stacked at the other side of the transfer chamber 240. Further, the liquid treatment chamber 260s and the drying chambers 280 may be provided in various dispositions unlike the foregoing description.

The buffer unit 220 is disposed between the transfer frame 140 and the transfer chamber 240. The buffer unit 220 provides a space in which the substrate W stays before the substrate W is transferred between the transfer chamber 240 and the transfer frame 140. Slots (not illustrated) on which the substrate W is placed are provided inside the buffer unit 220, and the plurality of slots (not illustrated) is provided so as to be spaced apart from each other in the third direction 16. A surface of the buffer unit 220 facing the transfer frame 140 and a surface of the buffer unit 220 facing the transfer chamber 240 are opened.

The transfer frame 140 transfers the substrate W between the carrier 18 seated on the load port 120 and the buffer unit 220. An index rail 142 and an index robot 144 are provided to the transfer frame 140. The index rail 142 is provided so that a longitudinal direction thereof is parallel to the second direction 14. The index robot 144 is installed on the index rail 142, and linearly moves in the second direction 14 along the index rail 142. The index robot 144 includes a base 144a, a body 144*b*, and an index arm 144*c*. The base 144*a* is installed to be movable along the index rail 142. The body 144*b* is coupled to the base 144*a*. The body 144*b* is provided to be movable in the third direction 16 on the base 144*a*. Further, the body 144*b* is provided to be rotatable on the base 144*a*. The index arm 144*c* is coupled to the body 144*b* and is provided to be movable forwardly and backwardly with respect to the body 144*b*. A plurality of index arms 144*c* is provided to be individually driven. The index arms 144*c* are disposed to be stacked in the state of being spaced apart from each other in the third direction 16. A part of the index arms 144*c* may be used when the substrate W is transferred from the process processing module 20 to the carrier 18, and another part of the plurality of index arms 144*c* may be used when the substrate W is transferred from the carrier 18 to the process processing module 20. This may prevent the particles generated from the substrate W before the process processing from being attached to the substrate W after the process processing in the process in which the index robot 144 loads and unloads the substrate W.

The transfer robot 244 transferring the substrate W into and out of the liquid treatment chamber 260 and the drying chamber 280 that are the treatment chambers through the entrances of the liquid treatment chamber 260 and the drying chamber 280 is provided to the transfer chamber 240. According to the exemplary embodiment, the transfer robot 244 transfers the substrate W between the buffer unit 220, the liquid treatment chamber 260, and the drying chamber 280. The transfer robot 244 is provided to be movable along the guide rail 242. The guide rail 242 is disposed so that the longitudinal direction thereof is parallel to the first direction 12. The transfer robot 244 is installed on the guide rail 242, and linearly moves on the guide rail 242 in the first direction 12. Further, the transfer robot 244 is movable up and down in the third direction 16. Further, the transfer robot 244 is rotatable in the third direction as an axis. In the transfer chamber 240, a fan unit 246 generating a downdraft in a transferring region therein is provided. The downdraft prevents inside foreign substances, such as particles and fumes, from floating. When the substrate W is transferred from the liquid treatment chamber 260 to the drying chamber 280, the substrate W is transferred in the state where the liquid supplied from the liquid treatment chamber 260 remains.

Figure 4:
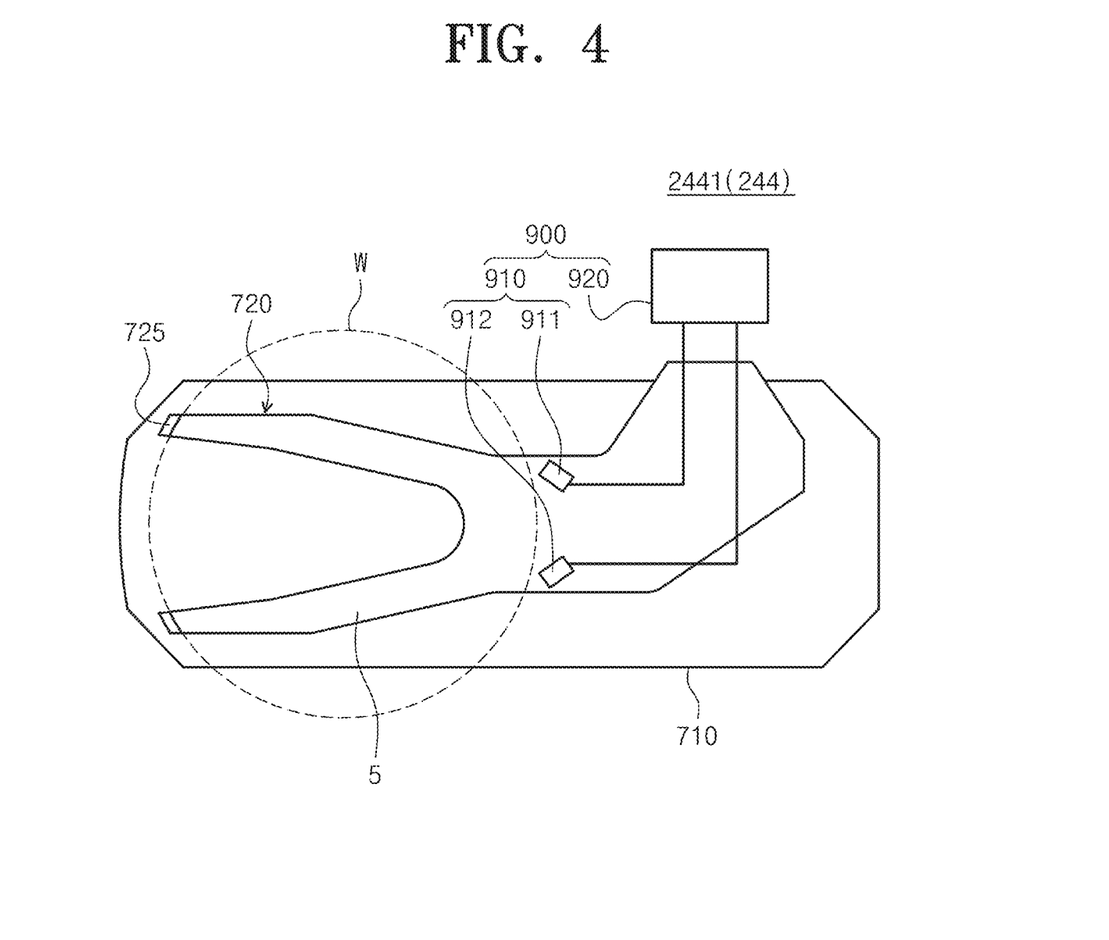
FIG. 4 is a top plan view schematically illustrating a transfer robot according to a first exemplary embodiment of the present invention.

FIG. 4 is a top plan view schematically illustrating the transfer robot according to a first exemplary embodiment of the present invention. The transfer robot will be described with reference to FIG. 4. A transfer robot 2441 according to a first exemplary embodiment of the present invention is an example of the transfer robot 244. The transfer robot 2441 includes a base 710 and a hand 720.

The base 710 is linearly movable in a horizontal direction and a vertical direction, and may be provided to be rotatable based on an axis parallel to the vertical direction. The hand 720 is coupled to the base 710. According to the exemplary embodiment, the hand 720 is provided above the base 710.

The hand 720 grips the substrate W. The hand 720 is provided to be linearly movable forward and backward. For example, the hand 720 moves forward from the top of the base 710 to take over the substrate W at a position where a seating portion 721 of the hand 720 deviates from an upper surface of the base 710. Thereafter, the transfer robot 244 moves the base 710 in the state where the hand 720 moves backward in the state where the substrate W is placed and is located at a position facing the upper surface of the base 710, to move the base 710 to a position adjacent to a target position at which the substrate W is to be placed. Thereafter, the hand 720 takes over the substrate W to the target position in the state of being moved forward so as to be placed above the target position.

According to the exemplary embodiment, the hand 720 includes the seating part 721 and guide protrusions 725. The substrate W is seated on the seating part 721. A plurality of protrusions supporting the bottom surface of the substrate W may be provided to an upper surface of the seating part 721. The guide protrusion 725 supports a front lateral portion of the substrate W that is seated in the proper position of the seating part 721. The guide protrusion 725 protrudes upward from the seating part 721. The plurality of guide protrusions 725 may be provided to be spaced apart from each other.

A driving member (not illustrated) moves the hand 720 forward and backward. According to the exemplary embodiment, the driving member (not illustrated) includes a motor providing driving force moving the hand 720.

According to the exemplary embodiment, a camera 910 is provided to the transfer robot 244. The camera 910 includes a first camera 911 photographing a first side and a second camera 912 photographing a second side. The camera 910 photographs the substrate W in the horizontal direction and monitors an edge region of a liquid film L. Data captured by the camera 910 is transmitted to a controller 920. The controller 920 measures a contact angle of the liquid film L. As a more particular example, the controller 920 measures a contact angle of the edge region of the liquid film L. The case of utilizing the measured contact angle will be described below in detail. The camera 910 may be positioned above a pusher guide (not illustrated) for adjusting the position of the substrate W placed on the seating part 721 to the proper position.

Figure 5:
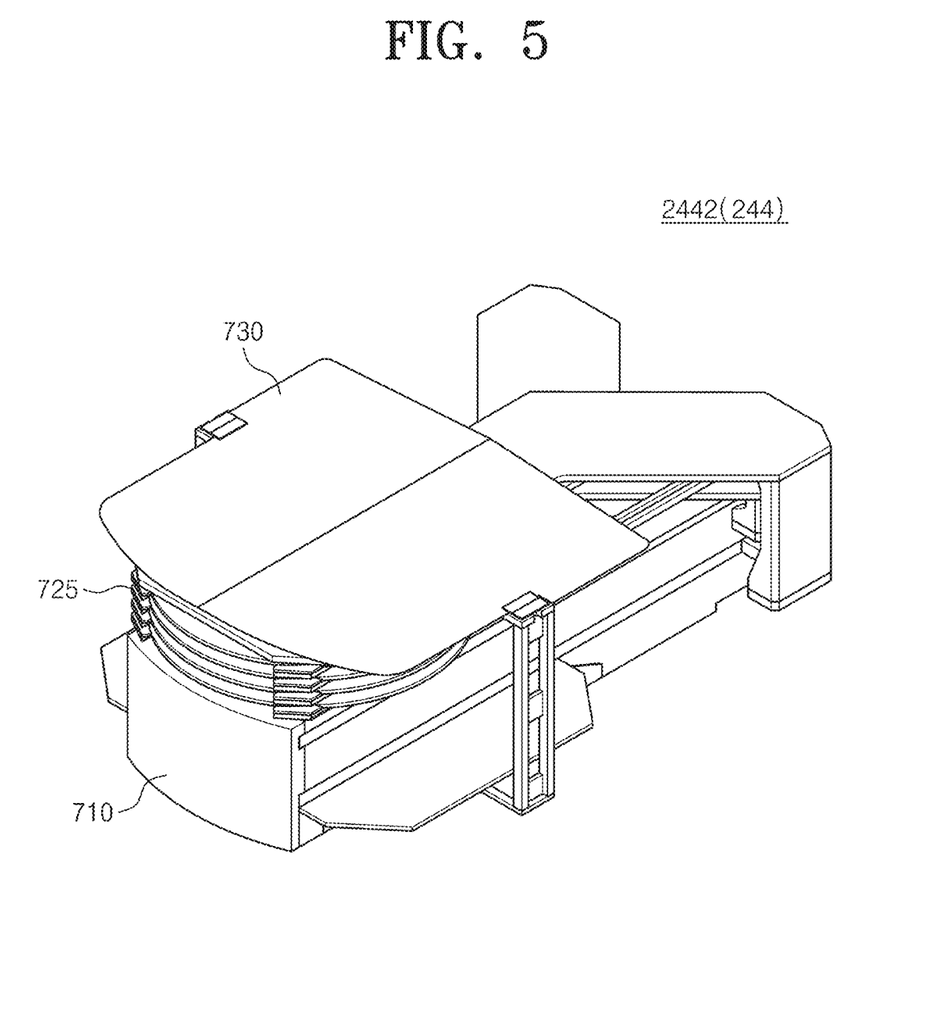
FIG. 5 is a perspective view schematically illustrating a transfer robot according to a second exemplary embodiment of the present invention.
Figure 6:
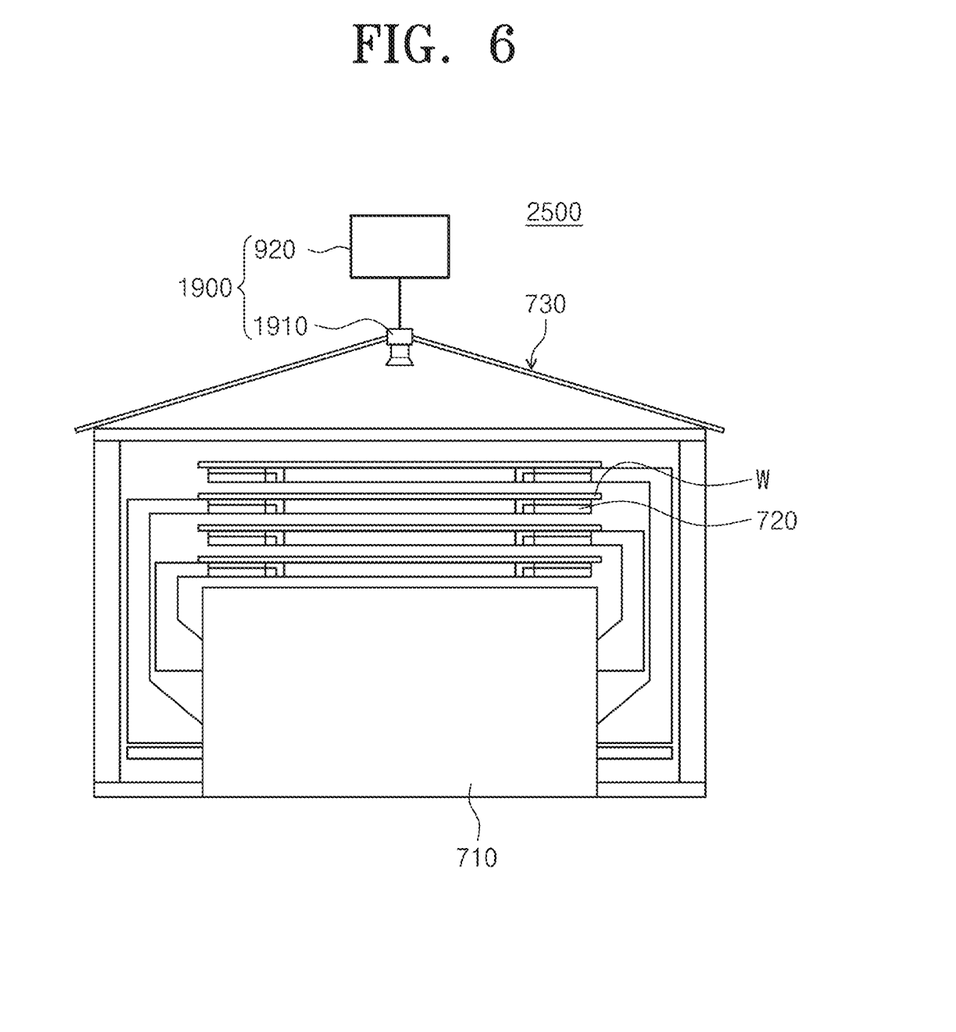
FIG. 6 is a front view illustrating the transfer robot of FIG. 5 viewed from the front.

FIG. 5 is a perspective view schematically illustrating a transfer robot according to a second exemplary embodiment of the present invention. FIG. 6 is a front view illustrating the transfer robot of FIG. 5 viewed from the front. A transfer robot 2442 will be described with reference to FIGS. 5 and 6 as an example of the transfer robot 244 provided in FIGS. 2 and 3. The transfer robot 2442 includes a base 710, a hand 720, and a shade member 730.

The base 710 is provided to be moved along the guide rail 242. The base 710 supports the hand 720.

The substrate W is placed on the hand 720. The hand 720 is provided to be stretchable relative to the base 710. The hand 710 directly loads or unloads the substrate W into or from the liquid treatment chamber 260 and the drying chamber 280 that are the treatment chambers through the entrances. The plurality of hands 720 may be provided to be stacked with each other.

The shade member 730 minimizes a downdraft formed by the fan unit 246 from reaching the substrate placed on the hand 720. The shade member 730 is fixedly coupled to the base 710 so as to be disposed above the hand 720. When the hand 720 loads or unloads the substrate W into or from the liquid treatment chamber 260 and the drying chamber 280 that are the treatment chambers, the shade member 730 may be disposed at a position higher than the upper ends of entrances 261 and 281. When viewed from the top, the shade member 730 is provided with a larger area than that of the substrate W.

The shade member 730 is provided inclined so that a height is lowered from the center toward both sides. Therefore, the downdraft flows out of the region of the hand 720 where the substrate W is provided along the inclined surface of the shade member 730. When viewed from the top, the shade member 730 may be provided so that one lateral surfaces of two plates are fixedly coupled to each other in the central region of the hand 720. Each plate may be provided to be inclined in a down direction from the center region to the edge region of the hand 720. When the hand 720 loads or unloads the substrate into or from the liquid treatment chamber 260 and the drying chamber 280 that are the treatment chambers, the shade member 730 is disposed at a position higher than the upper ends of the entrances of the liquid treatment chamber 260 and the drying chamber 280 that are the treatment chambers. The shade member 730 is provided to be sufficiently adjacent to the entrances 261 and 281 so as to prevent the downdraft from being introduced through the entrances 261 and 281. As described above, the shade member 730 is provided above the hand 720, so that the downdraft is prevented from being in directly contact to the substrate W placed on the hand 720 during the transferring of the substrate within the transfer chamber 240.

Further, the transfer robot 2442 may suppress the downdraft from being introduced through the entrances when the substrate W is loaded/unloaded into/from the liquid treatment chamber 260 and the drying chamber 280 that are the treatment chambers. The shade member 730 is provided with an uninterruptible material for preventing the generation of static electricity. For example, the shade member 730 may be made of an uninterruptable vinyl chloride resin (PVC).

According to the exemplary embodiment, a camera 1910 is installed in the shade member 730. The camera 1910 may be installed at the highest position of the shade member 730. The camera 1910 may be provided as a camera capable of measuring a height of the liquid film. The camera 1910 photographs the substrate W from the above and monitors the height of the liquid film L. Data captured by the camera 1910 is transmitted to a controller 920. The controller 1910 calculates a height for each region of the liquid film L. As a more particular example, the controller 920 calculates a height of the edge region of the liquid film L. The case of utilizing the measured height will be described below in detail.

Figure 7:
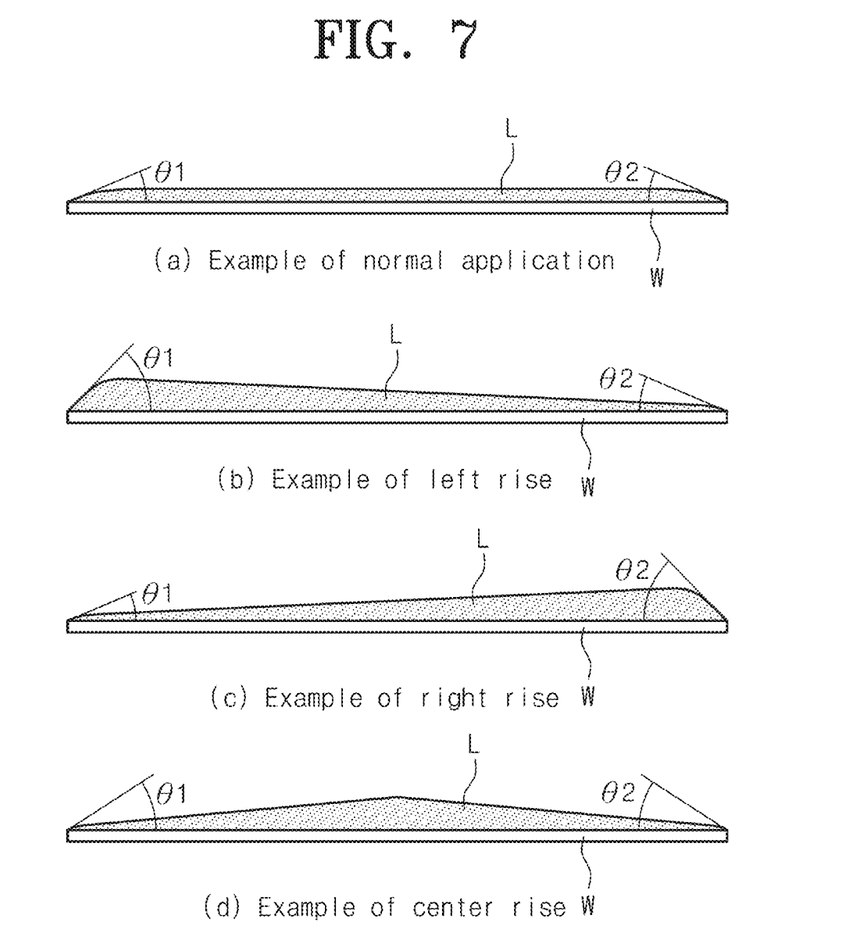
FIG. 7 is a cross-sectional view illustrating an example of a behavior of a solvent.

FIG. 7 is a cross-sectional view illustrating an example of a behavior of a solvent. A behavior of a solvent L as the liquid film formed on the substrate W will be described with reference to FIG. 7. For example, even though the amount of chemical liquid discharged to the surface of the substrate W is set to 10 g at the time of initial set-up and the amount of chemical liquids is the same according to the behavior of the chemical liquid while the substrate W moves to the drying chamber 280, a thickness of the chemical liquid L may be different for each region on the surface of the substrate W. For example, as referenced from the drawings of (b), (c), and (d), the case where the liquid film L is raised to the left because the chemical liquid is biased to the left ((b) the example of the left rise), the case where the liquid film L is raised to the right because the chemical liquid is biased to the right ((c) the example of the right rise), and the case where the liquid film L is raised because the chemical liquid is collected to the center ((d) the example of the center rise) are the representative cases. Like the representative example, when the behavior of the chemical liquid occurs and the substrate is moved to the drying chamber 280 in the non-uniform state of the liquid film L and then drying proceeds, since the evaporation amount is different depending on the thickness of the chemical liquid L, local evaporation may occur first. The local evaporation eventually leads to pattern collapse or leaning which are drying defects.

Figure 8:
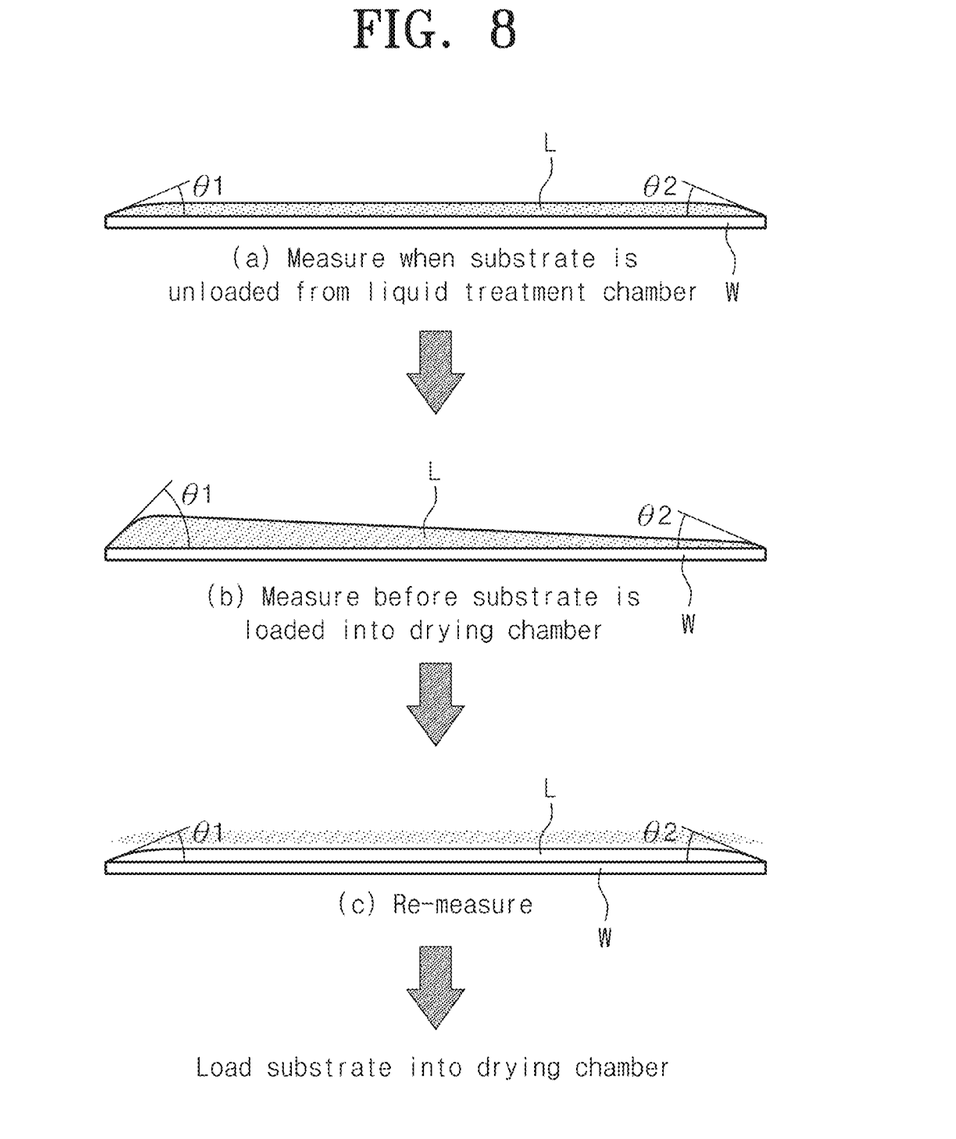
FIG. 8 is a diagram illustrating a flow of a substrate treating method according to an exemplary embodiment of the present invention.
Figure 9:
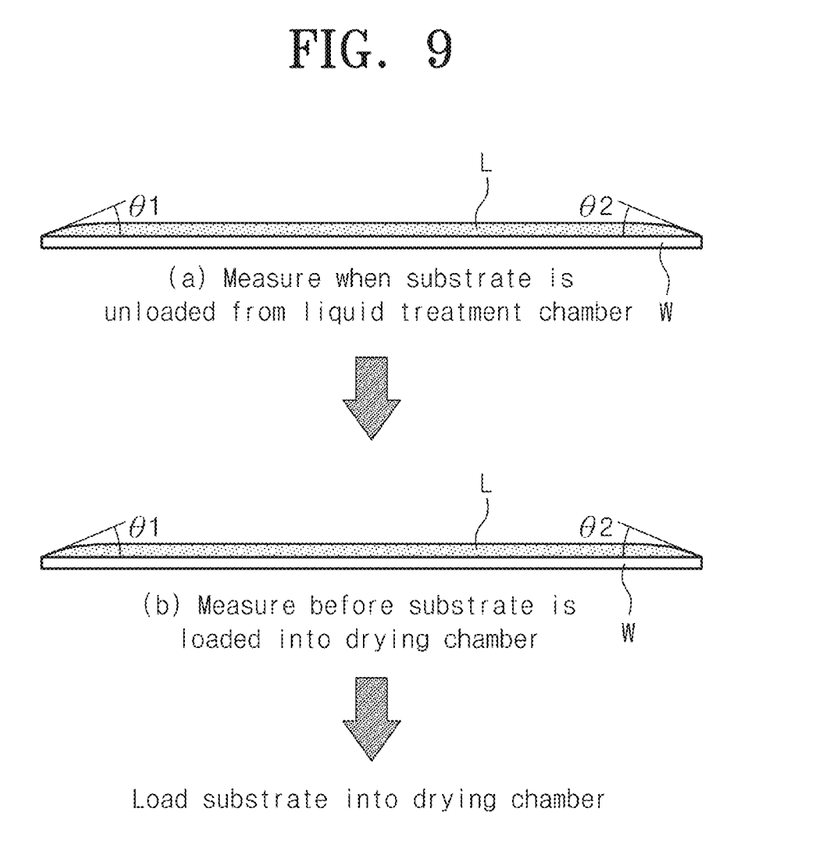
FIG. 9 is a diagram illustrating a flow of a substrate treating method according to an exemplary embodiment of the present invention.

FIG. 8 is a diagram illustrating a flow of a substrate treating method according to an exemplary embodiment of the present invention. FIG. 9 is a diagram illustrating a flow of a substrate treating method according to an exemplary embodiment of the present invention. The substrate treating method will be described with reference to FIGS. 8 and 9.

After a substrate W is wetted with a chemical liquid (for example, an IPA) in the liquid treatment chamber 260, a form of a liquid film is measured in the state where the transfer robot 244 picks up the substrate W and the measured form of the liquid film is stored as first data. Then, the form of the liquid film is measured before the substrate W is injected into the drying chamber 280 and the measured form of the liquid film is stored as second data. The first data and the second data are compared. As described in FIG. 8, when the form of the liquid film according to the second data and the form of the liquid film according to the first data are compared and a result of the comparison is out of a set error range, whether to load the substrate W to the drying chamber 280 is determined and the data is stored. When the drying defect occurs in the substrate W, the stored data may be used for post analysis. As described in FIG. 9, when the form of the liquid film according to the second data and the form of the liquid film according to the first data are compared and a result of the comparison is within the set error range, the substrate W is loaded into the drying chamber 280 and the data is stored. When the drying defect occurs in the substrate W, the stored data may be used for post analysis.

According to the first exemplary embodiment, the measurement of the form of the chemical liquid is to measure a contact angle of the chemical liquid. After the substrate W is wetted with a chemical liquid (for example, an IPA) in the liquid treatment chamber 260, the camera 910 photographs an edge region of the liquid film L in the state where the transfer robot 244 picks up the substrate W. The controller 920 measures the contact angle of the liquid film L from the photographed data and stores the measured contact angle as first data. Then, the camera 910 photographs the edge region of the liquid film L before the substrate W is injected into the drying chamber 280. The controller 920 measures the contact angle of the liquid film L and stores the measured contact angle as second data. The controller 920 compares the first data and the second data. When the contact angle of the liquid film according to the second data is compared with the contact angle of the liquid film according to the first data and a result of the comparison is out of a set error range, whether to load the substrate W to the drying chamber 280 is determined and the data is stored. For example, when the contact angle of the liquid film according to the second data is compared with the contact angle of the liquid film according to the first data and the result of the comparison is out of the set error range, the controller 920 waits for a set time until the liquid film L on the substrate W stabilizes itself, and when a result of the re-measurement is within the error range, the substrate W may be loaded into the drying chamber 280.

According to the second exemplary embodiment, the measurement of the form of the chemical liquid is to measure a height of the chemical liquid for each region. After the substrate W is wetted with a chemical liquid (for example, an IPA) in the liquid treatment chamber 260, the camera 1910 photographs an entire region of the liquid film L in the state where the transfer robot 244 picks up the substrate W. A controller 1920 measures a height of the liquid film L for each region from the photographed data and stores the measured height as first data. Then, the camera 1910 photographs the entire region of the liquid film L before the substrate W is injected into the drying chamber 280. The controller 1920 measures the height of the liquid film L for each region and stores the measured height as second data. The controller 1920 compares the first data and the second data. When the height of the liquid film for each region according to the second data is compared with the height of the liquid film for each region according to the first data and a result of the comparison is out of a set error range, or the height of the liquid film for each region according to the second data is such that the pattern collapse is likely to occur, whether to load the substrate W to the drying chamber 280 is determined and the data is stored. For example, when the height of the liquid film according to the second data is compared with the height of the liquid film according to the first data and the result of the comparison is out of the set error range, the controller 1920 waits for a set time until the liquid film L on the substrate W stabilizes itself, and when a result of the re-measurement is within the error range, the substrate W may be loaded into the drying chamber 280.

As the exemplary embodiment of the present invention, the camera 910 is provided to the hand of the transfer robot 244, but the camera 910 may be provided to an end of a bowl that collects the treatment liquid in the cleaning chamber. Further, the camera 910 may also be provided to both sides of the entrance through which the substrate W is inserted in the drying chamber 280. If the camera 910 is capable of measuring the contact angle of the edge region of the substrate W as in the first embodiment of the present invention, the design may be changed so that the camera 910 is provided in other places other than the presented example.

According to the exemplary embodiment of the present invention, the liquid treatment device and facility, the monitoring system for the liquid film discharged and formed on the surface of the substrate W is provided, so that it is possible to solve a problem in the part unit when the problem occurs after the drying completion.

The controller may control the constituent elements of the substrate treating apparatus and facility so that the substrate is treated according to a set process. Further, the controller may include a process controller formed of a microprocessor (computer) executing the control of the substrate treating apparatus and facility, a keyboard on which a command input manipulation is performed in order for an operator to manage the substrate treating apparatus and facility, a user interface formed of a display and the like visualizing and displaying an operation situation of the substrate treating apparatus, and a storage unit in which a control program for executing the process executed in the substrate treating apparatus and facility under the control of the controller or a program, that is, a processing recipe, for executing the processing to each configuration according to various data and processing conditions, are stored. Further, the user interface and the storage unit may be connected to the process controller. The processing recipe may be stored in a storage medium in the storage unit, and the storage medium may be a hard disk, and may also be a portable disk, such as a CD-ROM or a DVD, or a semiconductor memory, such as a flash memory.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A substrate treating apparatus, comprising:
    a liquid treatment chamber configured to treat a substrate with a liquid;
    a drying chamber configured to dry the liquid-treated substrate;
    a transfer robot configured to transfer the substrate between the liquid treatment chamber and the drying chamber, and including a hand which is movable along an X-axis, a Y-axis, and a Z-axis and is rotatably driven based on the Z-axis, and on which the substrate is placed;
    an optical system configured to photograph a form of a liquid film of the substrate, in which when the substrate is transferred from the liquid treatment chamber to the drying chamber, the substrate is wetted with a chemical liquid and is transferred by the transfer robot in a state of being formed with & the liquid film formed; and
    a controller configured to measure the form of the liquid film photographed by the optical system, the form including a contact angle of the liquid film and the substrate.

2. The substrate treating apparatus of claim 1, wherein the optical system transmits first data obtained by photographing the form of the liquid film to the controller in the state where the transfer robot picks up the substrate in the liquid treatment chamber,
    before the transfer robot injects the substrate into the drying chamber, the optical system transmits second data obtained by photographing the form of the liquid film to the controller, and
    the controller compares the first data and the second data, and when the form of the liquid film of the second data is out of an error range in comparison with the first data, the controller determines whether to load the substrate into the drying chamber and stores the second data.

3. The substrate treating apparatus of claim 2 wherein the stored second data is provided as analysis data when drying defect of the substrate occurs in the drying chamber.

4. The substrate treating apparatus of claim 3, wherein the optical system measures a height of the liquid film.

5. The substrate treating apparatus of claim 1, wherein the optical system is a camera which photographs an edge region of the substrate from a lateral surface of the substrate.

6. The substrate treating apparatus of claim 5, wherein the camera is provided to photograph a first lateral surface of the substrate and a second lateral surface that is the other side of the first lateral surface.

7. The substrate treating apparatus of claim 6, wherein the controller measures a first contact angle that is a contact angle of the chemical liquid with respect to the first lateral surface of the substrate and a second contact angle that is a contact angle of the chemical liquid with respect to the second lateral surface of the substrate.

8. The substrate treating apparatus of claim 1, wherein the optical system transmits first data obtained by photographing the form of the liquid film to the controller in the state where the transfer robot picks up the substrate in the liquid treatment chamber, before the transfer robot injects the substrate into the drying chamber, the optical system transmits second data obtained by photographing the form of the liquid film to the controller, the controller measures a first contact angle that is a contact angle of the chemical liquid with respect to a first lateral surface of the substrate and a second contact angle that is a contact angle of the chemical liquid with respect to a second lateral surface of the substrate, and the controller compares the first contact angle of the first data and the first contact angle of the second data, and compares the second contact angle of the first data and the second contact angle of the second data, and when the first contact angle and the second contact angle of the second data are out of error ranges of the first contact angle and the second contact angle of the first data, the controller determines whether to load the substrate into the drying chamber and stores the second data.

9. The substrate treating apparatus of claim 1, wherein the transfer robot further includes a shade member disposed above the hand, and the optical system is provided while being installed in the shade member.

10. The substrate treating apparatus of claim 1, wherein a plurality of liquid treatment chambers is provided while being stacked in an array of N columns and M rows, a plurality of drying chambers is provided while being stacked in an array of n columns and m rows, and the transfer robot transfers the substrate to a position according to a recipe between the plurality of liquid treatment chambers and the plurality of drying chambers.

11. The substrate treating apparatus of claim 1, wherein the drying chamber is a supercritical treatment chamber which dries the substrate with a supercritical fluid.

12. A substrate treating apparatus, comprising:

a plurality of liquid treatment chambers provided while being stacked in an array of N columns and M rows and configured to treat a substrate with a liquid;

a plurality of drying chambers provided while being stacked in an array of n columns and m rows and configured to dry the liquid-treated substrate;

a transfer robot configured to transfer the substrate between one of the liquid treatment chambers and one of the drying chambers, and including a hand which is movable along an X-axis, a Y-axis, and a Z-axis and is rotatably driven based on the Z-axis, and on which the substrate is placed;

an optical system configured to photograph a form of a liquid film of the substrate, in which when the substrate is transferred from the one of the liquid treatment chambers to the one of the drying chambers, the substrate is wetted with a chemical liquid and is transferred by the transfer robot in a state of being formed with the liquid film; and a controller configured to measure the form of the liquid film photographed by the optical system, wherein the optical system transmits first data obtained by photographing the form of the liquid film to the controller in a state where the transfer robot picks up the substrate in the one of the liquid treatment chambers, before the transfer robot injects the substrate into the one of the drying chambers, the optical system transmits second data obtained by photographing the form of the liquid film to the controller, the controller compares the first data and the second data, and when the form of the liquid film of the second data is out of an error range in comparison with the first data, the controller determines whether to load the substrate into the one of the drying chambers and stores the second data, and the stored second data is provided as analysis data when drying defect of the substrate occurs in the one of the drying chambers.

* * * * *